(12) United States Patent
Popp et al.

(10) Patent No.: US 9,721,992 B2
(45) Date of Patent: Aug. 1, 2017

(54) ORGANIC OPTOELECTRONIC COMPONENT WITH A LIGHT EMITTING ELEMENT AND A LIGHT DETECTING ELEMENT AND METHOD FOR OPERATING SUCH AN ORGANIC OPTOELECTRONIC COMPONENT

(71) Applicant: OSRAM OLED GmbH, Regensburg (DE)

(72) Inventors: Michael Popp, Freising (DE); Marc Philippens, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 3 days.

(21) Appl. No.: 14/432,554

(22) PCT Filed: Oct. 25, 2013

(86) PCT No.: PCT/EP2013/072394
§ 371 (c)(1),
(2) Date: Mar. 31, 2015

(87) PCT Pub. No.: WO2014/067871
PCT Pub. Date: May 8, 2014

(65) Prior Publication Data
US 2015/0340409 A1    Nov. 26, 2015

(30) Foreign Application Priority Data
Nov. 2, 2012 (DE) .......................... 10 2012 220 050

(51) Int. Cl.
*H01L 27/15* (2006.01)
*H01L 27/28* (2006.01)
(Continued)

(52) U.S. Cl.
CPC ....... *H01L 27/288* (2013.01); *H05B 33/0896* (2013.01); *H01L 51/0042* (2013.01); *H01L 2251/533* (2013.01); *H01L 2251/5323* (2013.01)

(58) Field of Classification Search
CPC ........... H01L 27/288; H01L 2251/5323; H01L 2251/533; H01L 51/0042; H05B 33/0896
See application file for complete search history.

(56) References Cited

U.S. PATENT DOCUMENTS 7,460,222 B2   12/2008   Kalveram et al.
7,859,621 B2   12/2010   Zhang et al.
(Continued)

FOREIGN PATENT DOCUMENTS

CN    1364285 A    8/2002
EP    1467408 A2   10/2004
(Continued)

*Primary Examiner* — Duy T Nguyen
(74) *Attorney, Agent, or Firm* — Slater Matsil, LLP

(57) ABSTRACT

An organic optoelectronic component and a method for operating an organic optoelectronic component are disclosed. In an embodiment an organic optoelectronic component includes an organic light emitting element including an organic functional layer stack having an organic light emitting layer between two electrodes and an organic light detecting element including a first organic light detecting element including a first organic light detecting layer, and a second organic light detecting element including a second organic light detecting layer, wherein the organic light emitting element and the organic light detecting element are arranged laterally adjacent on a common substrate, wherein the first organic light detecting element is configured to detect ambient light, wherein the second organic light detecting layer of the second organic light detecting element is arranged between two non-transparent layers, the non- (Continued)

transparent layers shade the second organic light detecting layer of the second organic light detecting element from ambient light.

16 Claims, 7 Drawing Sheets

(51) Int. Cl.
    *H05B 33/08*     (2006.01)
    *H01L 51/00*     (2006.01)

(56) References Cited

U.S. PATENT DOCUMENTS

| | | |
|---|---|---|
| 2001/0035848 A1 | 11/2001 | Johnson et al. |
| 2003/0214240 A1 | 11/2003 | Lee et al. |
| 2004/0031965 A1 | 2/2004 | Forrest et al. |
| 2006/0264143 A1 | 11/2006 | Lee et al. |
| 2007/0051945 A1 | 3/2007 | Nakayama et al. |
| 2008/0230792 A1* | 9/2008 | Jiang .................... H01L 33/145 257/94 |
| 2009/0134309 A1 | 5/2009 | Leo et al. |
| 2010/0201275 A1 | 8/2010 | Cok et al. |
| 2011/0042766 A1* | 2/2011 | Kurokawa ........ G02F 1/133514 257/432 |
| 2011/0284721 A1 | 11/2011 | Iwabuchi et al. |
| 2012/0056205 A1 | 3/2012 | Allard et al. |
| 2012/0061689 A1 | 3/2012 | Yan et al. |
| 2012/0091923 A1 | 4/2012 | Kastner-Jung et al. |
| 2013/0105823 A1* | 5/2013 | Kurokawa ........ H01L 27/14623 257/84 |
| 2014/0021491 A1 | 1/2014 | Meng et al. |

FOREIGN PATENT DOCUMENTS

| | | |
|---|---|---|
| EP | 2065698 A1 | 6/2009 |
| JP | 2003150117 A | 5/2003 |
| JP | 200781203 A | 3/2007 |
| WO | 0169583 A1 | 9/2001 |
| WO | 2004048881 A2 | 6/2004 |
| WO | 2004088627 A1 | 10/2004 |
| WO | 2010066245 A1 | 6/2010 |

* cited by examiner

ORGANIC OPTOELECTRONIC COMPONENT WITH A LIGHT EMITTING ELEMENT AND A LIGHT DETECTING ELEMENT AND METHOD FOR OPERATING SUCH AN ORGANIC OPTOELECTRONIC COMPONENT

This patent application is a national phase filing under section 371 of PCT/EP2013/072394, filed Oct. 25, 2013, which claims the priority of German patent application 10 2012 220 050.9, filed Nov. 2, 2012, each of which is incorporated herein by reference in its entirety.

TECHNICAL FIELD

An organic optoelectronic component and a method for operating the organic optoelectronic component are specified.

BACKGROUND

In illuminated environments, changed ambient conditions can change the illumination conditions or brightnesses. By way of example, the ambient conditions can change with regard to the current illumination, which corresponds to short-term processes, and as a result of ageing processes in the luminous sources used, which corresponds to long-term processes. Changed ambient conditions with regard to the illumination arise, for example, in the case of changed light incidence through windows into an illuminated room at different times of day. Surface light sources such as an organic light emitting diode (OLED), for instance, can furthermore be subject to ageing processes, as a result of which the luminance in total decreases over time depending on the OLED layer construction and processing. The decrease in the luminance can be caused, for example, by elevated temperatures which can occur during operation and can damage the organic materials.

In order to keep the luminance in the environment of a luminous source such as a surface light source, for instance, constant over time, the light emitted by the luminous source can be regulated, for example, by means of manual dimming or by means of an electronic circuit which controls the luminous source on the basis of a measurement signal from one or a plurality of externally connected sensors. As external sensors it is possible to use, for example, photodiodes, photoconductors, phototransistors or photothyristors for detecting the entire radiation power emitted by the luminous source at a preselected location, and, by means of an external interconnection or wiring, they can be part of a control of the luminous source. However, such a possibility usually requires a high complexity and causes additional costs. Manual dimming, by contrast, enables only imprecise coordination with lighting conditions actually present and causes an unnecessary waste of energy and, under certain circumstances, incorrect illumination conditions.

Since the known control possibilities for surface light sources have a high interconnection complexity or cannot be automated, an automatic readjustment of the luminance is not possible without considerable additional outlay.

SUMMARY OF THE INVENTION

In accordance with at least one embodiment, an organic optoelectronic component comprises at least one organic light emitting element comprising an organic functional layer stack having at least one organic light emitting layer between two electrodes. In particular, the at least one organic light emitting element is embodied as organic light emitting diode (OLED) which can emit visible light during operation through the electrodes.

The organic optoelectronic component furthermore comprises at least one organic light detecting element.

Furthermore, the organic optoelectronic component comprises a common substrate for the at least one organic light emitting element and the at least one organic light detecting element, which are arranged in particular on the common substrate in laterally adjacent area regions. The organic light emitting element and the organic light detecting element are furthermore arranged in a same plane as a result of the common arrangement on the same substrate in laterally adjacent area regions, wherein the organic light emitting element and the organic light detecting element in each case directly adjoin the substrate.

The common substrate can be in particular the sole substrate of the organic optoelectronic component. The functional layer stacks and the electrodes of the organic light emitting and light detecting elements of the organic optoelectronic component are in this case applied successively or simultaneously in particular on the common substrate, such that the common substrate is that substrate which is necessary and provided for producing the organic light emitting and light detecting elements. In other words, the organic light emitting and light detecting elements are not produced on dedicated substrates and then arranged on the common substrate, but rather are produced on the common substrate. Consequently, in this case, no further substrate is arranged in particular between the common substrate and the organic functional layers of the organic light emitting and light detecting elements.

Here and hereinafter, "lateral" denotes a direction parallel to the main extension plane of the common substrate. A lateral direction is thus directed, for example, perpendicularly to the stacking direction of the electrodes and of the organic functional layer stack of the at least one organic light emitting element.

Furthermore, the at least one organic light emitting element and the at least one organic light detecting element are all arranged on the same side of the common substrate. Particularly preferably, with regard to further optoelectronic elements, that is to say further light emitting or light detecting elements, which can be arranged on the common substrate, the at least one organic light detecting element can be directly adjacent to the at least one organic light emitting element, that is to say that no further organic light emitting or light detecting elements are present in a lateral direction between the at least one organic light detecting element and the at least one organic light emitting element.

The at least one organic light emitting element is embodied as transparent and designed to emit light through the substrate and in a direction facing away from the substrate. In other words, the at least one organic light emitting element is embodied as a transparent OLED and as emissive on both sides with two emission sides, wherein one emission side is formed by the substrate side and the other side is formed by the side situated opposite the substrate as viewed from the at least one light emitting layer. For this purpose, the substrate is embodied as transparent. Furthermore, both electrodes are embodied as transparent or transmissive to light at least in a partial region.

Here and hereinafter, "transparent" denotes a layer, which can also comprise a sequence of layers, which is transmissive to visible light. In this case, the transparent layer can be clearly translucent or else at least partly light scattering and/or partly light absorbing, such that a layer designated as transparent can, for example, also be diffusely or milkily translucent. Particularly preferably, a layer designated here as transparent is embodied as transmissive to visible light as far as possible in such a way that in particular the absorption of light generated in the organic light emitting element is as low as possible.

The transparent common substrate can, for example, comprise or be composed of a transparent plastic. By way of example, the transparent common substrate can be embodied in the form of a glass plate or glass layer or else in the form of a plastic plate, plastic layer or plastic film or else in the form of a glass-plastic laminate comprising at least one glass layer and at least one plastic layer.

By way of example, a transparent electrode can be composed of or comprise a transparent conductive oxide (TCO). Furthermore, a transparent electrode can comprise a transparent metal, that is to say a metal having a thickness that is small enough such that the electrode is at least partly transmissive to light. Furthermore, a transparent electrode can also be embodied as a ring contact. Here and hereinafter, "ring contact" denotes any form of an electrode which has an opening enclosed completely or only partly by electrode material in a lateral direction. In particular, a U-shaped electrode, for example, can also come under the term ring contact. Furthermore, an electrode designated as a ring contact can also have a plurality of openings. Furthermore, a transparent electrode can comprise, for example, metallic network structures, metal meshes and/or graphene, for example, Ag-doped graphene.

The at least one organic light detecting element is selected from at least one first organic light detecting element and at least one second organic light detecting element each comprising at least one organic light detecting layer. In particular, the at least one organic light detecting element can be designed to convert light incident on the at least one organic light detecting layer into an electrically measurable signal, for instance a voltage, a current or an electrical resistance.

In accordance with a further embodiment, the at least one organic light detecting element comprises or is composed of at least one first organic light detecting element. The at least one first organic light detecting element is designed to detect ambient light.

In accordance with a further embodiment, the at least one organic light detecting element comprises or is composed of at least one second organic light detecting element. The at least one organic light detecting layer of the at least one second organic light detecting element is arranged between two non-transparent layers, which shade the at least one light detecting layer of the at least one second light detecting element from ambient light. In order to achieve an effective shading of the at least one organic light detecting layer of the at least one second organic light detecting element from ambient light, the at least one organic light detecting layer is preferably arranged between the two non-transparent layers in the stacking direction, such that in the stacking direction one non-transparent layer is arranged below and one non-transparent layer above the at least one organic light detecting layer.

Hereinafter, "ambient light" here denotes light, in particular visible light, which can impinge from outside on the organic optoelectronic component and thus also on the at least one organic light detecting element, that is to say which is not guided within the organic optoelectronic component by means of internal scattering and/or light guiding effects from the at least one light emitting element to the at least one organic light detecting element.

In particular, ambient light which is shaded by the non-transparent layers can also denote light having spectral components which correspond to the absorption spectrum of the at least one organic light detecting layer of the at least one second light detecting element. In other words, the non-transparent layers of the second organic light detecting element are designed in particular in such a way that they shade the at least one organic light detecting layer from at least that portion of the ambient light which corresponds to the absorption spectrum of the at least one organic light detecting layer and furthermore to the absorption spectrum of the at least one second organic light detecting element.

By virtue of the fact that the at least one organic light detecting layer of the at least one second light detecting element is shaded from the ambient light by the two non-transparent layers, what is achieved, in particular, is that the portion—passing to the at least one organic light detecting layer of the at least one second light detecting element—of ambient light radiated onto the at least one second light detecting element from outside is reduced in comparison with an organic light detecting element without the two non-transparent layers. Preferably, the shading brings about a reduction of greater than or equal to 90% and particularly preferably of greater than or equal to 99% or even of greater than or equal to 99.9% in the ambient light radiated onto the at least one second organic light detecting element from outside. That means, in other words, that less than 10% and preferably less than 1% of the ambient light is radiated onto the at least one organic light detecting layer of the at least one second organic light detecting element. In particular, the non-transparent layers can also be completely non-transmissive to ambient light and in particular that spectral component of the ambient light which corresponds to the absorption spectrum of the at least one second organic light detecting element.

In accordance with a further embodiment, the at least one first and/or second organic light detecting element is embodied and usable as organic photodiode. The organic photodiode can comprise in particular an organic functional layer stack between two electrodes, wherein the organic functional layer stack has as organic light detecting layer of the first and/or second organic light detecting element at least one pn junction for generating charge carriers. By way of example, the organic photodiode, with regard to the electrodes and the organic functional layer stack, can have the same construction as the at least one organic light emitting element and can be operated inversely with respect to the at least one organic light emitting element, that is to say with opposite electrical polarity, as a result of which it may be possible that the manufacture of the organic optoelectronic component causes no or hardly any additional costs in comparison with an exclusively light emitting component. As an alternative thereto, the organic photodiode, in comparison with the organic light emitting element, can comprise other materials and/or other layer constructions with regard to the electrodes and/or the organic functional layer stack, as a result of which, although an additional outlay may be necessary during manufacture, the sensitivity of the at least one organic light detecting element can be adapted in a targeted manner.

In accordance with a further embodiment, the at least one first and/or second organic light detecting element is embodied and usable as organic photoconductor comprising an organic photoconductive material as organic light detecting layer, which material generates electrical charges upon irradiation by light. Organic photoconductive materials can be embodied, for example, in one layer on an electrically conductive layer, for example, an electrode. Furthermore, organic photoconductive materials can be embodied, for example, in at least two layers comprising at least one organic layer which generates charge carriers and an organic layer which transports charge carriers. Furthermore, an organic light detecting element embodied as an organic photoconductor can have the same construction as the at least one organic light emitting element.

Depending on the materials and construction of the at least one first and/or second organic light detecting element, the latter can also be constructed simultaneously as photoconductor and photodiode. Such an organic light detecting element can be usable as photodiode with an electrical bias voltage and as photoconductor without an electrical bias voltage.

Furthermore, depending on the materials and construction used, the electrical resistance of the at least one first and/or second organic light detecting element can also be measured, such that the at least one first and/or second organic light detecting element can be embodied and usable as organic photoresistor.

In particular, it may be advantageous, as described above, if the at least one organic light detecting element and the at least one organic light emitting element have an identical construction. Furthermore, it may also be possible for the organic light detecting element to comprise only n- or p-conducting layers or an optoelectronic layer and for these to be identical to the corresponding layers of the organic light emitting element.

The at least one organic light emitting element and the at least one organic light detecting element, with regard to their respective electrodes and organic functional layers, are preferably embodied in a manner respectively electrically isolated from one another on the substrate. In other words, the at least one organic light detecting element covers an area region on the common substrate which is spatially separated from the area region covered by the at least one organic light emitting element on the common substrate. As an alternative thereto, depending on the electrical driving of the organic light emitting element and of the organic light detecting element, it may also be possible for these to have a common electrode.

In accordance with a further embodiment, the at least one organic light detecting element, with regard to its area occupation on the common substrate, is embodied as smaller than the at least one organic light emitting element. In particular, the at least one organic light detecting element can cover on the common substrate an area which is less than or equal to ten percent or less than or equal to five percent or less than or equal to one percent of the area covered by the at least one organic light emitting element on the common substrate. In other words, the majority of the common substrate can be covered with the at least one organic light emitting element or, if appropriate, with a plurality of organic light emitting elements, while the at least one organic light detecting element or, if appropriate, a plurality of organic light detecting elements occupy only a small area region, such that the organic optoelectronic component has during operation a luminous area which can substantially correspond to the total area of the common substrate.

In accordance with a further embodiment, the at least one first organic light detecting element is designed to detect ambient light through the transparent common substrate. If the at least one first organic light detecting element has an electrode between the at least one organic light detecting layer and the common substrate, then said electrode, in the case of ambient light detection through the substrate, is likewise embodied as transparent or has at least one light-transmissive region. This can mean that the electrode is embodied as a ring contact, for example, or is formed by a transparent material.

In accordance with a further embodiment, the at least one first organic light detecting element is designed to detect ambient light which is radiated onto the organic optoelectronic component from the opposite side of the organic optoelectronic component relative to the substrate. If the at least one first organic light detecting element has an electrode on that side of the organic light detecting layer which faces away from the substrate, then said electrode is preferably embodied as transparent or as a ring contact. If the organic optoelectronic component has an encapsulation and/or a cover on the side facing away from the common substrate at least in the region of the first organic light detecting element, then said encapsulation and/or said cover are/is likewise embodied as transparent in this case.

In accordance with a further embodiment, the organic optoelectronic component is designed in such a way that part of the light generated in the at least one organic light emitting element during operation is guided internally in the organic optoelectronic component to the at least one organic light detecting element and in particular to the at least one organic light detecting layer thereof. Such internal light guiding from the at least one organic light emitting element to the at least one organic light detecting element can be carried out, for example, by means of waveguiding effects and/or by scattering effects within the organic optoelectronic component. Internal light guiding can, for example, also be influenced by an internal scattering layer. Particularly preferably, light is guided internally from the at least one organic light emitting element to the at least one organic light detecting element in the case where the at least one organic light detecting element comprises or is composed of a second organic light detecting element. Furthermore, it may also be desirable that light which is generated by the at least one organic light emitting element and is guided internally is detected in addition to ambient light by a first organic light detecting element. The following description of possibilities for internal light guiding therefore apply equally to a first and a second organic light detecting element.

By way of example, the transparent common substrate can form an optical waveguide which guides light from the at least one organic light emitting element internally in the organic optoelectronic component to the at least one organic light detecting element. If the at least one organic light detecting element has an electrode between the at least one organic light detecting layer and the common substrate in the case of light guiding through the substrate, then said electrode is likewise embodied as transparent or has at least one light-transmissive region. This can also mean that the electrode is embodied as a ring contact, for example.

As an alternative or in addition to the common substrate as internal optical waveguide, other layers of the organic optoelectronic component can also serve as optical waveguide between the organic light emitting element and the at least one organic light detecting element. By way of example, an encapsulation and/or a cover arranged above the organic layers, as viewed from the common substrate, can bring about internal light guiding from the organic light emitting element to the at least one organic light detecting element. A layer or an element of the organic optoelectronic component which serves as internal optical waveguide is particularly preferably embodied as transparent. Light guiding effects can in particular also be brought about by means of suitable differences in refractive index between individual layers or elements of the organic optoelectronic component. By means of a suitable choice of the differences in refractive index and/or the transparency of the layers and elements of the organic optoelectronic component which are intended to contribute to light guiding, the portion of the light guided internally from the organic light emitting element to the at least one organic light detecting element can be settable.

In accordance with a further embodiment, the organic optoelectronic component is designed such that light generated during operation in the at least one light emitting layer of the at least one organic light emitting element is radiated internally in the organic optoelectronic component directly onto the at least one organic light detecting layer of the at least one organic light detecting element. That can mean, in particular, that no layers or elements which shade the at least one organic light detecting layer completely from the organic light emitting layer are present between the at least one organic light emitting layer and the at least one organic light detecting layer of the at least one organic light detecting element.

In accordance with at least one embodiment, a method for operating the organic optoelectronic component comprises an electronic component, for example, a regulatable current and/or voltage source. The electronic component measures the light detected by the at least one organic light detecting element and regulates the at least one organic light emitting element depending on the measurements. The fact that the electronic component measures the light respectively detected by the at least one organic light detecting element means, in particular, that the electronic component measures the electronically measurable signal of the at least one organic light detecting element.

If the at least one organic light detecting element is embodied as first organic light detecting element or comprises such an element, the electronic component measures the light which is detected by the at least one first light detecting element and which comprises ambient light. If the at least one organic light detecting element is embodied as second organic light detecting element or comprises such an element, the electronic component measures the light which is detected by the at least one second organic light detecting element and which comprises light guided internally in the optoelectronic component from the at least one light emitting element to the at least one second organic light detecting element.

By way of example, the electronic component, that is to say, for example, a regulatable current and/or voltage source, can be at least partly integrated into the organic optoelectronic component. In other words, the regulatable current and/or voltage source can be formed by an electronic component which is embodied as a hybrid or monolithic electronic circuit which can be integrated in the common substrate, for example, or which can be embodied in the form of additional functional layers on the common substrate. By way of example, for this purpose, the common substrate can comprise at least partly an integrated circuit on the basis of a semiconductor material, for example, silicon and/or printed electronics. As an alternative thereto, it may also be possible for the electronic component, that is to say, for example, the regulatable current and/or voltage source, to be embodied as an external electronic component which is interconnected with the organic optoelectronic component by means of suitable electrical connections such as, for instance, conductor tracks and/or wire connections.

Furthermore, it may also be possible for the at least one organic light emitting element and the at least one organic light detecting element to be interconnected separately from one another. For this purpose, the at least one organic light emitting element can be connected to an electronic component in the form of a current and/or voltage source, while the organic light detecting element is connected to an electronic component in the form of a current and/or voltage and/or resistance measuring instrument.

The features and embodiments described above and below apply equally to the organic optoelectronic component and the method for operating the organic optoelectronic component.

As a result of the hybrid or monolithic integration of the at least one organic light detecting element, which can have, for example, the same layer construction as the at least one organic light emitting element, on a preferably small, separated area region of the common substrate, in addition to the at least one organic light emitting element one or a plurality of sensor elements can be integrated with low complexity in the organic optoelectronic component described here, said sensor element(s) being provided for external and/or internal light detection. Depending on the intensity of the ambient light incident on the first organic light detecting element or of the internally guided light which is incident on the second organic light detecting element and which is part of the light generated by the organic light emitting element, an electrically measurable signal such as, for instance, a photovoltage, a photocurrent or a resistance change is generated which, in terms of absolute value, turns out to be all the higher, the higher the incident light intensity. The electrically measurable signal of the at least one organic light detecting element can be processed further in an electronic circuit which can be formed by an external electronic component or which can form a part of the organic optoelectronic component as a hybrid or monolithic element. By means of the electronic circuit, the organic light emitting element can in turn be controlled such that the luminous intensity at the location of the at least one organic light detecting element and the emission intensity of the organic light emitting element can be kept constant directly. The area of the at least one organic light detecting element or, if appropriate, the areas of a plurality of organic light detecting elements can be adapted such that in each case a sufficiently stable electrically measurable signal can be generated during operation, without an instability of the light source, that is to say of the at least one organic light emitting element, being brought about on account of unstable feedbacks.

In the case of the organic optoelectronic component described here, it may advantageously be possible to achieve an exact automatic readjustment of the emitted light intensity of the organic light emitting element without one or more external sensors, which can considerably reduce in particular the circuitry outlay in comparison with known solutions. In particular, the light emitting diode can be kept constant automatically at the light originating location by virtue of the fact that it is possible to react independently to internal changes such as ageing processes of the light source and/or to external changes such as changed ambient light, for instance, with the use of a first and/or a second organic light detecting element. Consequently, the luminance at the light originating location can be kept constant automatically independently of ageing properties of the light source and/or under variable ambient conditions. In this case, it is possible to make use of the fact, for example, that the organic light detecting elements described here age significantly more slowly than the at least one organic light emitting element, since, in particular, the organic materials of the organic light detecting elements are subjected to less loading, in particular less thermal loading.

By way of example, in the case of a detection of ambient light in the case of a change in brightness of the surroundings, for example, on account of different times of day and/or different weather conditions, the luminous intensity emitted by the at least one organic light emitting element can be continuously readjusted. By way of example, in this case the organic optoelectronic component can be fitted to a window and, given sufficient brightness, for example, on the exterior side of the window, can be switched off and transparent in the switched-off state, while if there is lower brightness or darkness on the exterior side of the window the organic light emitting element can be used for room lighting.

In accordance with a further embodiment, in the case where the at least one organic light detecting element comprises or is a second organic light detecting element, at least one of the two non-transparent layers is formed by a non-transparent covering layer. The non-transparent covering layer can in this case cover the area region on which the at least one second organic light detecting element is situated on the opposite side of the substrate. The non-transparent covering layer can comprise or be composed of, for example, a non-transparent plastic or a non-transparent metal, for example, aluminum or some other metal described further below, for example, in association with electrodes. Particularly preferably, one of the two non-transparent layers can be formed by a non-transparent covering layer arranged on a side of the common substrate facing away from the at least one organic light detecting layer of the second organic light detecting element. Furthermore, it is also possible to arrange a non-transparent covering layer between the substrate and the at least one organic light detecting layer, that is to say on the side of the substrate facing the at least one organic light detecting layer, as a non-transparent layer. Furthermore, it is also possible for a non-transparent covering layer to be arranged above the at least one organic light detecting layer as viewed from the substrate.

In accordance with a further embodiment, at least one of the non-transparent layers is formed by an electrode of the at least one second organic light detecting element. Particularly preferably, an electrode embodied as a non-transparent layer can be arranged on that side of the at least one organic light detecting layer of the at least one second organic light detecting element which faces away from the common substrate. Alternatively or additionally, the at least one second organic light detecting element can also have an electrode between the at least one organic light detecting layer and the common substrate, said electrode being embodied as non-transparent layer. An electrode embodied as a non-transparent layer can comprise, in particular, a non-transparent metal, that is to say a metal having a sufficient thickness. For this purpose, all customary metals and metal compounds that can be used for electrodes, such as, for instance, the metals and metal compounds described further below, are appropriate provided that they form a non-transparent layer.

In accordance with a further embodiment, one of the two non-transparent layers is formed by at least one part of an encapsulation and/or of a cover which, as viewed from the common substrate, is arranged above the at least one organic light detecting layer of the at least one second light detecting element. For this purpose, provision can be made of an encapsulation and/or a cover, as described further below, which comprises at least one layer formed from a non-transparent material at least in the region of the at least one second organic light detecting element. Furthermore, it may also be possible for a non-transparent covering layer as described above to be applied on that side of an encapsulation and/or of a cover which faces away from the at least one organic light detecting layer of the second organic light detecting element, said cover layer forming one of the two non-transparent layers.

Furthermore, combinations of the abovementioned possibilities for the two non-transparent layers are also possible.

Furthermore, a first organic light detecting element can also comprise a non-transparent layer as described for the second organic light detecting element, for example, for the case where the first organic light detecting element is provided only for detection on one side.

In accordance with a further embodiment, the organic optoelectronic component comprises both at least one first organic light detecting element and at least one second organic light detecting element. This advantageously enables separate detection of internally guided light by the at least one second organic light detecting element and of ambient light by the at least one first organic light detecting element. Additionally or alternatively, the organic optoelectronic component can comprise a plurality of first and/or second organic light detecting elements. This means that a plurality of organic light detecting elements can be arranged on the common substrate. In particular, the plurality of the organic light detecting elements and the at least one organic light emitting element are arranged on the same side of the common substrate.

By way of example, the organic optoelectronic component can comprise a plurality of first organic light detecting elements each designed to detect ambient light. By means of a plurality of first organic light detecting elements, ambient light can be detected, for example, at different positions of the organic optoelectronic component. Furthermore, it is also possible that, with different first organic light detecting elements, ambient light can be detected from different sides of the organic optoelectronic component.

In accordance with a further embodiment, at least one of the plurality of first organic light detecting elements is designed to detect ambient light through the substrate, while at least another of the plurality of first organic light detecting elements is designed to detect ambient light from the opposite side of the organic optoelectronic component relative to the substrate. In other words, at least two first organic light detecting elements are present, which can detect ambient light from different sides of the organic optoelectronic component independently of one another. In particular, at least two of the plurality of first organic light detecting elements can have different detection sides for the detection of ambient light.

Furthermore, it may also be possible that, for example, one first organic light detecting element is provided which detects ambient light only on one side of the organic optoelectronic component, and is thus embodied in a manner providing detection on one side, while a further first organic light detecting element can detect ambient light on both sides of the organic optoelectronic component and is thus embodied in a manner providing detection on both sides.

Furthermore, the organic optoelectronic component can comprise a plurality of second organic light detecting elements, each of which comprises at least one organic light detecting layer arranged between two non-transparent layers, which shade the respective at least one organic light detecting layer from ambient light. The respective non-transparent layers can be embodied identically or differently for the second organic light detecting elements. By means of a plurality of second organic light detecting elements, internally guided light can be detected, for example, at different positions of the organic optoelectronic component. As a result, it may be possible, for example, to measure the uniformity of an organic optoelectronic component embodied as a surface light source.

In accordance with a further embodiment, a plurality of organic light emitting elements are arranged on the common substrate. In particular, the plurality of the organic light emitting elements and the at least one organic light detecting element are all arranged on the same side of the common substrate. The organic light emitting elements of the plurality of organic light emitting elements can be regulatable, for example, separately from one another, such that the individual organic light emitting elements can be enabled to be switched on or off independently of one another, for example. Furthermore, each of at least two of the plurality of organic light emitting elements can be assigned in each case at least one organic light detecting element, preferably one first and one second organic light detecting element, in relation to the control. As a result, it may be possible for the luminous area of the organic optoelectronic component, said luminous area being formed by the totality of the organic light emitting elements, to be subdivided into functional regions which are formed by the organic light emitting elements and which can be regulated independently of one another and can be controlled with regard to the respectively emitted light power with the aid of the organic light detecting elements.

The fact that an organic light emitting element is assigned an organic light detecting element means, in particular, that the light detecting element and the light emitting element form a functional unit with regard to the brightness regulation of the light emitting element. Furthermore, it can also mean that the organic light detecting element is closest to the assigned organic light emitting element in comparison with further organic light emitting elements.

The organic optoelectronic component described here can enable regulated influencing of the brightness of the transparent at least one organic light emitting element by means of a signal feedback of the at least one organic light detecting element, which can be embodied in the form of one or a plurality of monolithically integrated sensors. As a result, the brightness can be readjusted individually in an automated manner depending on the ambient conditions and/or depending on ageing effects.

BRIEF DESCRIPTION OF THE DRAWINGS

Further advantages, advantageous embodiments and developments will become apparent from the exemplary embodiments described below in association with the figures.

In the figures.

In the exemplary embodiments and figures, elements that are identical, of identical type or act identically may be provided in each case with the same reference signs. The illustrated elements and their size relationships among one another should not be regarded as true to scale; rather, individual elements such as, for example, layers, component parts, components and regions may be illustrated with an exaggerated size in order to enable better illustration and/or in order to afford a better understanding.

DETAILED DESCRIPTION OF ILLUSTRATIVE EMBODIMENTS

Figure 1:
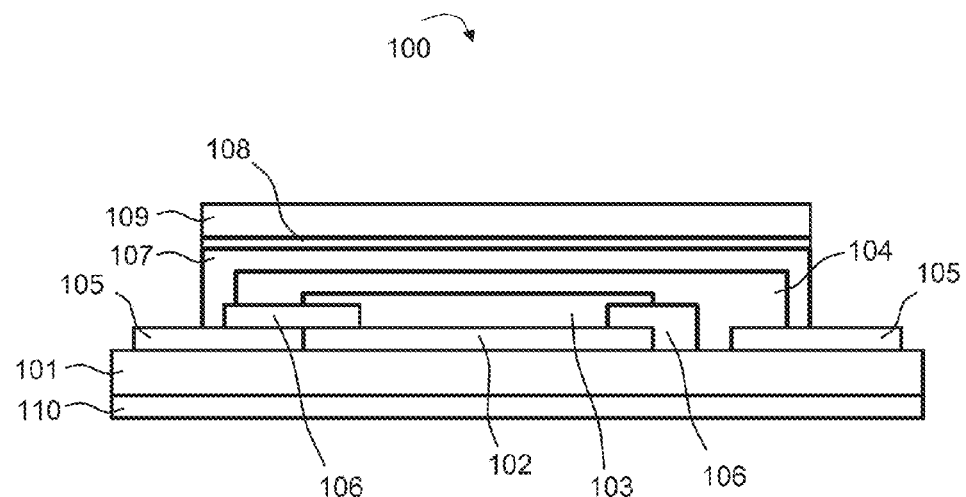
FIG. 1 shows a schematic illustration of an organic light emitting element in accordance with one exemplary embodiment.

FIG. 1 shows, in accordance with one exemplary embodiment, the basic construction of a transparent organic light emitting element 100 embodied as a transparent organic light emitting diode (OLED).

The organic light emitting element 100, which may also be designated as OLED 100 hereinafter, comprises a substrate 101, on which an organic functional layer stack 103 having at least one organic light emitting layer is arranged between transparent electrodes 102 and 104, such that light generated in the organic functional layer stack 103 during the operation of the OLED 100 can be radiated through the transparent electrodes 102, 104. Furthermore, the substrate 101 is embodied as transparent, for example, in the form of a glass plate or glass layer. As an alternative thereto, the substrate 101 can, for example, also comprise a transparent plastic or a glass-plastic laminate.

At least one of the transparent electrodes 102, 104 comprises a transparent conductive oxide, for example. Transparent conductive oxides (TCO) are transparent conductive materials, generally metal oxides, such as, for example, zinc oxide, tin oxide, cadmium oxide, titanium oxide, indium oxide and indium tin oxide (ITO). Alongside binary metal-oxygen compounds, such as, for example, ZnO, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and can also be p- or n-doped.

The further of the transparent electrodes 102, 104 can comprise a metal, for example, which can be selected from aluminum, barium, indium, silver, gold, magnesium, calcium and lithium, and compounds, combinations and alloys therewith, and which has a thickness small enough to be light-transmissive. In particular, a metal-comprising electrode can comprise Ag, Al or alloys or layer stacks comprising these, for example, Ag/Mg, Ag/Ca, Mg/Al or Mo/Al/Mo or Cr/Al/Cr.

Alternatively or additionally, it is also possible for both electrodes 102, 104 to comprise a TCO material mentioned above. Furthermore, a transparent electrode can, for example, also comprise metallic network structures or conductive networks or metallic meshes, for example, comprising or composed of silver, and/or graphene or carboncontaining layers. Furthermore, one or both electrodes 102, 104 can comprise a layer stack comprising at least one TCO and at least one metal and/or one of the further materials mentioned.

In the exemplary embodiment shown, the bottom electrode 102 is embodied as an anode, while the top electrode 104 is embodied as a cathode. With an appropriate choice of materials, however, a construction reversed with respect to the polarity is also possible.

The electrodes 102, 104 are preferably embodied in large-area and continuous fashion, such that the organic light emitting element 100 is shaped as a luminous source, in particular as a surface light source. In this case, "large-area" can mean that the organic light emitting element 100 has an area of greater than or equal to a few square millimeters, preferably greater than or equal to one square centimeter and particularly preferably greater than or equal to one square decimeter. As an alternative thereto, it may also be possible that at least one of the electrodes 102, 104 of the organic light emitting element 100 between which the organic functional layer stack 103 is situated is embodied in a structured fashion, as a result of which a spatially and/or temporally structured and/or variable luminous impression, for example, for structured lighting or for a display device, can be made possible by means of the organic light emitting element 100.

For electrically contacting the electrodes 102 and 104, as is shown in FIG. 1, electrode connection pieces 105 can also be provided, which extend through below the encapsulation 107 (described further below) from the electrodes 102, 104 toward the outside. The electrode connection pieces 105 embodied as electrical contact feeds can be embodied as transparent or non-transparent and can comprise or be composed of a TCO and/or a metal, for example. By way of example, the electrode connection pieces 105 can be formed by a metal layer or a metal layer stack, for example, Mo/Al/Mo, Cr/Al/Cr or Al.

The organic functional layer stack 103 can comprise, in addition to the at least one organic light emitting layer, further organic layers, for example, one or more selected from a hole injection layer, a hole transport layer, an electron blocking layer, a hole blocking layer, an electronic transport layer, an electron injection layer and a charge generation layer (CGL), which are suitable for conducting holes or electrons to the organic light emitting layer or for blocking the respective transport. The layers of the organic functional layer stack 103 can comprise organic polymers, organic oligomers, organic monomers, organic small, non-polymeric molecules ("small molecules"), or combinations thereof. In particular, it may be advantageous if the organic functional layer stack 103 comprises a functional layer embodied as a hole transport layer in order to enable an effective injection of holes into the organic light emitting layer. By way of example, tertiary amines, carbazole derivatives, conductive polyaniline or polyethylene dioxythiophene may prove to be advantageous as materials for a hole transport layer. Suitable materials for the light emitting layer include electroluminescent materials which exhibit radiation emission on account of fluorescence or phosphorescence, for example, polyfluorene, polythiophene or polyphenylene or derivatives, compounds, mixtures or copolymers thereof.

Furthermore, as shown in FIG. 1, insulator layers 106 can be present, for example, comprising or composed of polyimide, which insulator layers can electrically insulate the electrodes 102, 104 from one another, for example. Depending on the configuration of the individual layers of the OLED 100, insulator layers 106 moreover need not be absolutely necessary and may be absent, for instance in the case of corresponding mask processes for applying the layers.

An encapsulation 107 for protecting the organic functional layer stack 103 and the electrodes 102, 104 is arranged above the organic functional layer stack 103 and the electrodes 102, 104. In this case, the encapsulation 107 is particularly preferably embodied as a transparent thin-film encapsulation.

In the present case, an encapsulation embodied as a thin-film encapsulation is understood to mean a device suitable for forming a barrier with respect to atmospheric substances, in particular with respect to moisture and oxygen and/or with respect to further damaging substances such as, for instance, corrosive gases, for example, hydrogen sulfide. In other words, the thin-film encapsulation is embodied in such a way that at most very small portions of atmospheric substances can penetrate through it. This barrier effect in the case of the thin-film encapsulation is substantially produced by barrier layers and/or passivation layers which are embodied as thin layers and which are part of the encapsulation. The layers of the encapsulation generally have a thickness of less than or equal to a few 100 nm.

In particular, the thin-film encapsulation can comprise or consist of thin layers which are responsible for the barrier effect of the encapsulation. The thin layers can be applied, for example, by means of an atomic layer deposition (ALD) method or molecular layer deposition (MLD) method. Suitable materials for the layers of the encapsulation arrangement are, for example, aluminum oxide, zinc oxide, zirconium oxide, titanium oxide, hafnium oxide, lanthanum oxide, tantalum oxide. The encapsulation preferably comprises a layer sequence having a plurality of the thin layers, each having a thickness of between one atomic layer and a few 100 nm.

As an alternative or in addition to thin layers produced by means of ALD or MLD, the encapsulation can comprise at least one or a plurality of further layers, that is to say in particular barrier layers and/or passivation layers, which are deposited by a thermal vapor deposition or by means of a plasma-assisted process, for instance sputtering, chemical vapor deposition (CVD) or plasma-enhanced chemical vapor deposition (PECVD). Suitable materials therefor may be the abovementioned materials and silicon nitride, silicon oxide, silicon oxynitride, indium tin oxide, indium zinc oxide, aluminum-doped zinc oxide, aluminum oxide, and mixtures and alloys of the materials mentioned. The one or the plurality of further layers can have, for example, in each case a thickness of between 1 nm and 5 µm and preferably between 1 nm and 400 nm, inclusive of the limits.

As an alternative or in addition to a thin-film encapsulation, the encapsulation 107 can also comprise a glass lid which, for example, in the form of a glass substrate having a cavity, is adhesively bonded on the substrate 101 by means of an adhesive layer. Furthermore, a moisture-absorbing substance (getter), for example, composed of zeolite, can be adhesively bonded into the cavity in order to bind moisture, oxygen or other damaging gases which can penetrate through the adhesive. Furthermore, the adhesive layer for fixing the lid on the substrate may also itself be absorbent for damaging substances and/or adhesive layer structures may be present.

Furthermore, as shown in FIG. 1, a cover 109 adhesively bonded by means of an adhesive layer 108 can be arranged on the encapsulation 107, as viewed from the substrate 101. The cover 109, which can also be designated as "superstrate" in view of its arrangement in comparison with the substrate 101, is embodied as transparent and can be formed, for example, by a glass layer or glass plate or else a plastic or a combination or a laminate of the materials mentioned and, in particular in conjunction with an encapsulation 107 embodied as a thin-film encapsulation, can serve as mechanical protection, in particular as anti-scratch protection, without the cover 109 itself having to have an encapsulating effect. Alternatively or additionally, a protective lacquer, for example, in the form of a spray lacquer, can also be applied on the encapsulation 107.

In order to improve the coupling out of light, as shown in FIG. 1, an optical coupling-out layer 110 can be arranged, for example, on that side of the substrate 101 which faces away from the organic functional layer stack 103, said optical coupling-out layer being embodied, for example, as a scattering layer comprising scattering particles in a transparent matrix and/or having a light-scattering surface structure. It is also possible to arrange a coupling-out layer, for example, between the substrate 101 and the bottom electrode 102 arranged on the substrate 101. Furthermore, it is also possible to arrange a coupling-out layer above the top electrode 104, for example, on the cover 109 or between the cover 109 and the encapsulation 107. As an alternative thereto, it is also possible for no coupling-out layer 110 to be present, in order to achieve the greatest possible transparency of the OLED 100. By way of example, organic optoelectronic components without a coupling-out layer are shown in the following exemplary embodiments.

With regard to further features of the organic light emitting element 100, for example, with regard to the construction, the layer composition and the materials of the organic functional layer stack, of the electrodes and of the encapsulation, reference is made to International Application Publication No. WO 2010/066245 A1, which is hereby expressly incorporated by reference with regard to the construction of an organic light emitting component and also with regard to modifications and variations of the organic light emitting element shown in FIG. 1.

The exemplary embodiments shown hereinafter have in each case an organic light emitting element 100 which may be embodied in accordance with the exemplary embodiment in FIG. 1 or which may have modifications or variations with respect thereto. In particular, the features of the basic construction of the organic light emitting element 100 as shown in FIG. 1 should not be understood to be restrictive for the following exemplary embodiments.

Figure 2:
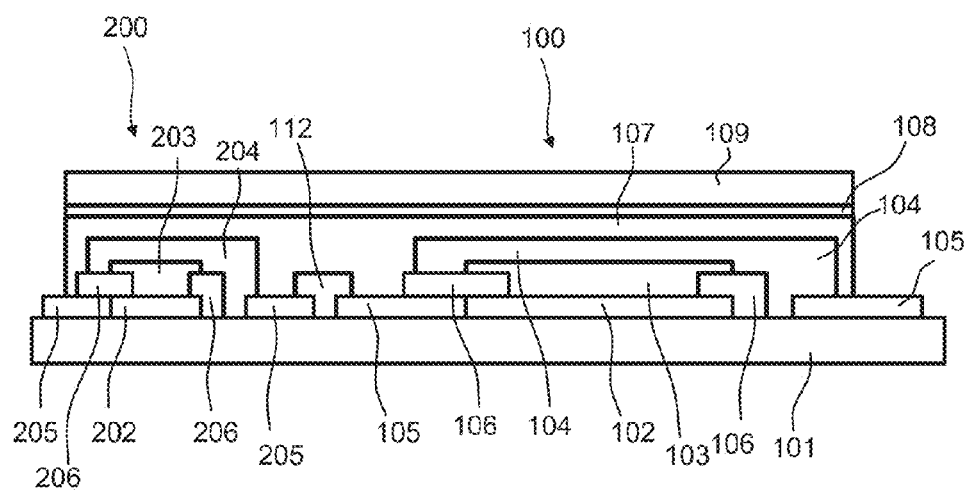
FIG. 2 shows a schematic illustration of an organic optoelectronic component in accordance with a further exemplary embodiment.

FIG. 2 shows an organic optoelectronic component in accordance with one exemplary embodiment, comprising alongside an organic light emitting element 100 at least one organic light detecting element embodied as first organic light detecting element 200. The first organic light detecting element 200 is arranged together with the organic light emitting element 100 on the substrate 101, such that the substrate 101 forms a common substrate for the organic light emitting element 100 and the first organic light detecting element 200. In particular, the organic light emitting element 100 and the first organic light detecting element 200 are arranged on the same side of the common substrate 101 in laterally adjacent area regions. As a result, the organic light emitting element 100 and the organic light detecting element 200 are applied to the substrate 101 in a same plane and in direct contact with said substrate.

The first organic light detecting element 200 comprises an organic functional layer stack 203 between two electrodes 202, 204, wherein the organic functional layer stack 203 comprises at least one organic light detecting layer. In the exemplary embodiment shown, the organic light detecting layer is embodied as a pn junction for generating charge carriers.

In particular, the organic light detecting element 200 in the exemplary embodiment shown, with regard to the electrodes 202, 204 and the organic functional layer stack 203, has the same construction as the organic light emitting element 100 with regard to the electrodes 102, 104 and the organic functional layer stack 103 and can be operated inversely with respect to the organic light emitting element 100, that is to say with opposite electrical polarity. As a result, the manufacture of the organic optoelectronic component shown may cause no or only low additional costs in comparison with an exclusively light emitting component. In particular, the first organic light detecting element 200 in the exemplary embodiment shown is embodied as transparent and can detect ambient light, as is also explained in association with FIG. 3B. In particular, the first organic light detecting element 200 can detect ambient light which is radiated onto the organic optoelectronic component on both sides. As an alternative thereto, the first organic light detecting element 200, in comparison with the organic light emitting element 100, can comprise different materials and/or have different layer constructions with regard to the electrodes 202, 204 and/or the organic functional layer stack 203, as is explained, for example, in connection with FIGS. 6A to 6F.

The organic optoelectronic component furthermore comprises an encapsulation 107, which is embodied as a thin-film encapsulation and which forms a common encapsulation for the organic light emitting element 100 and the first organic light detecting element 200. In other words, the encapsulation 107 extends with large area and continuously over the functional layers of the organic light emitting element 100 and of the first organic light detecting element 200. A common cover 109 is fixed on the common encapsulation 107 by means of an adhesive layer 108.

Furthermore, electrode connection pieces 205 are present, which serve for electrically contacting the electrodes 202, 204 and which can be embodied like the electrode connection pieces 105 of the organic light emitting element 100. The electrode connection pieces 105, 205 extend from the elements 100, 200 out of the encapsulation 107, such that the elements 100, 200 can be contacted externally.

An electrical insulator layer 112 is arranged between the organic light emitting element 100 and the organic light detecting element 200 directly on the substrate 101, said electrical insulator layer being covered by the common encapsulation 107. The electrical insulator layer 112, which can comprise or be composed of polyimide or some other electrically insulating material, for example, serves for electrically insulating the first organic light detecting element 200 from the organic light detecting element 100, such that the electrode connection pieces 105, 205 of the elements 100, 200 can also be arranged at a small distance from one another on the common substrate 101, without the occurrence of an electrical crosstalk between the elements 100, 200.

Figure 3A:
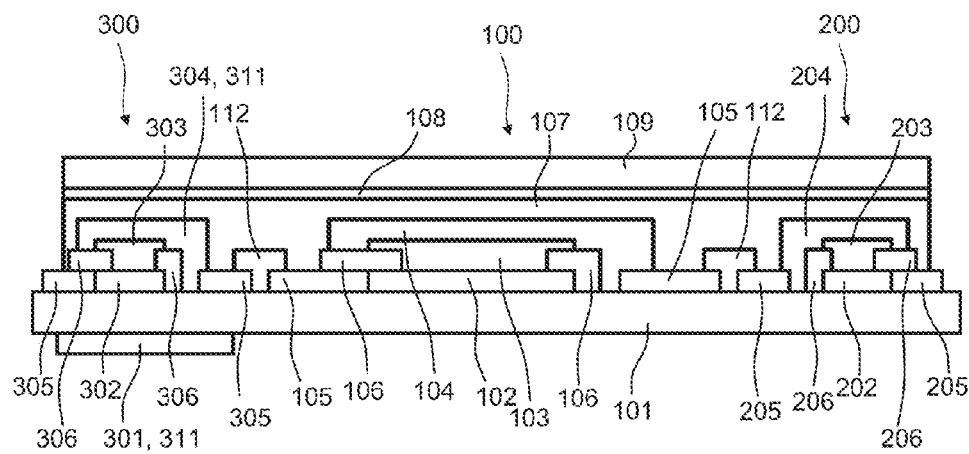
FIGS. 3A and 3B show schematic illustrations of an organic optoelectronic component and of the light relationships in the case of an organic optoelectronic component in accordance with further exemplary embodiments.
Figure 3B:
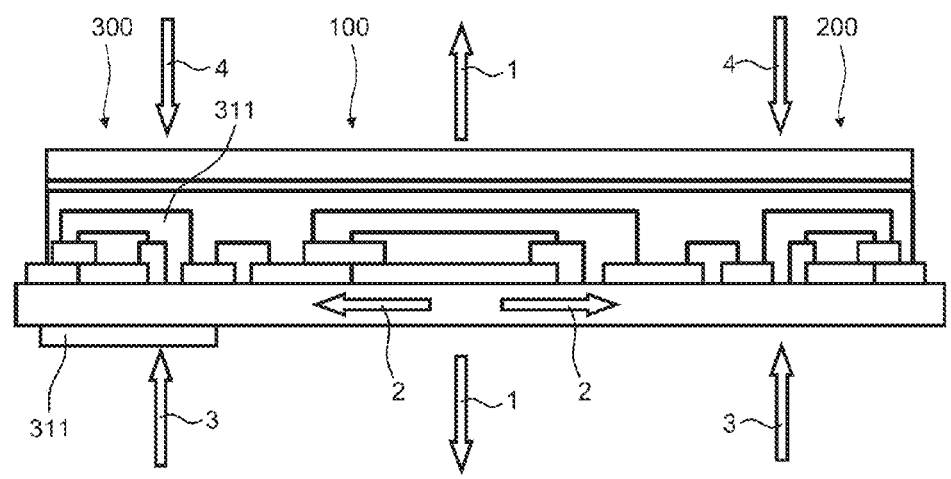

As an alternative to the first organic light detecting element 200, the organic optoelectronic component shown in FIG. 2 can also comprise, as at least one organic light detecting element, a second organic light detecting element 300, which is shown in association with FIGS. 3A and 3B and which is designed for detecting internally guided light instead of detecting ambient light.

FIG. 3A shows an organic optoelectronic component in accordance with one exemplary embodiment, comprising alongside an organic light emitting element 100 and a first organic light detecting element 200 as in the previous exemplary embodiment, in addition, a second organic light detecting element 300. The organic light detecting elements 200, 300 are arranged together with the organic light emitting element 100 on the substrate 101, such that the substrate 101 forms a common substrate for the organic light emitting element 100 and the organic light detecting elements 200, 300. In particular, the organic light emitting element 100 and the organic light detecting elements 200, 300 are arranged on the same side of the common substrate 101 in laterally adjacent area regions.

In the exemplary embodiment shown, purely by way of example, the second organic light detecting element 300 like the first organic light detecting element 200 is embodied and usable as organic photodiode. The second organic light detecting element 300 comprises an organic functional layer stack 303 between two electrodes 302, 304, wherein the organic functional layer stack 303 has at least one organic light detecting layer.

The at least one organic light detecting layer of the second organic light detecting element 300 is arranged between two non-transparent layers 311. One of the two non-transparent layers 311, which is arranged above the organic functional layer stack 303 as viewed from the common substrate 101, is formed by the top electrode 304, which comprises a non-transparent material, for example, a metal described above in connection with the electrodes 102, 104, such as aluminum, for instance, which has a sufficient thickness, typically greater than or equal to 100 nm, to be light-nontransmissive. The other of the two non-transparent layers 311 is formed by a non-transparent covering layer 301, which, in the exemplary embodiment shown, is arranged on that side of the common substrate 101 which faces away from the organic functional layer stack 303, and comprises a non-transparent metal and/or a non-transparent plastic. The non-transparent layers 311, as explained in greater detail in association with FIG. 3B, are provided and designed for shading the at least one organic light detecting layer of the second organic light detecting element 300 from ambient light.

The second organic light detecting element 300 can alternatively have a different construction, as is explained, for example, in association with FIGS. 6G to 6K.

The encapsulation 107 is embodied as in the previous exemplary embodiment as a common encapsulation for the organic light emitting element 100 and the organic light detecting elements 200, 300. As an alternative thereto, it is also possible to provide mutually separate encapsulations for the organic light emitting element and the organic light detecting elements.

Furthermore, electrode connection pieces 305 are present, which serve for electrically contacting the electrodes 302, 304 and which can be embodied like the electrode connection pieces 105 of the organic light emitting element 100. Furthermore, an electrical insulator layer 112 is arranged between the organic light emitting element 100 and the second organic light detecting element 300 directly on the substrate 101.

FIG. 3B indicates the light relationships during operation for the organic optoelectronic component from FIG. 3A. In FIG. 3B and also in the subsequent figures, the reference signs of the individual layers and parts of the organic optoelectronic component respectively shown are depicted principally only with regard to differences with respect to previously described exemplary embodiments, for the sake of clarity.

The organic light emitting element 100 in FIGS. 3A and 3B is embodied as transparent and emissive on both sides, as described in connection with FIG. 1, and during operation emits light 1 through the common substrate and the electrode embodied as transparent that is arranged between the organic functional layer stack and the common substrate, and through the top electrode embodied as transparent, the encapsulation and the covering layer, that is to say in the direction facing away from the substrate.

Through the transparent substrate, part of the light generated by the organic light emitting element 100 is guided internally in the organic optoelectronic component to the organic light detecting elements 200, 300 on account of scattering and waveguiding effects, as indicated by the arrows having the reference signs 2. Furthermore, depending on the embodiment of the electrodes, insulator layers and other layers and elements, alternatively or additionally it may also be possible for light to be guided in other layers internally from the organic light emitting element 100 to one or both organic light detecting elements 200, 300, for example, through the common encapsulation.

If the second organic light detecting element 300, as in the exemplary embodiment in FIGS. 3A and 3B, has an electrode 302 between the at least one organic light detecting layer and the common substrate 101, then said electrode, in the case of light guiding in the substrate 101, is likewise embodied as transparent or has at least one light-transmissive region. This can also mean that the electrode 302 is embodied as a ring contact, for example.

By means of a targeted adaptation of the respective distance between the organic light emitting element 100 and each of the organic light detecting elements 200, 300 and in this case in particular with regard to an absorption in the common substrate, by means of a suitable arrangement of one or a plurality of coupling-out layers on one or both sides of the common substrate and by means of a suitable choice of materials with regard to the electrodes, the insulator layers and the encapsulation, for example, with regard to a suitable refractive index for setting the total internal reflection in the substrate or the cover, the proportion of the light 2 guided internally from the organic light emitting element 100 in each case to the organic light detecting element 200 and to the organic light detecting element 300, can be set in a targeted manner. A complete suppression or at least a greatest possible reduction of the internally guided light 2 to the first organic light detecting element 200 may be desirable and advantageous in particular if the intention is for only ambient light detection, that is to say detection of external light, to be effected by the second organic light detecting element 200.

As is furthermore shown in FIG. 3B, ambient light 3, 4 can also be radiated onto the organic optoelectronic component. The ambient light can be radiated onto the organic optoelectronic component on the substrate side, indicated by the reference signs 3, and/or on the side of the cover, indicated by the reference signs 4, depending on the arrangement and embodiment of the organic optoelectronic component. The ambient light 3, 4 can be, for example, light from other natural or artificial light sources or else light 1 from the organic optoelectronic component which is reflected back onto the organic optoelectronic component by external reflection from outside.

The first organic light detecting element 200 is designed to detect ambient light 3, 4 from the substrate side and/or from the side of the cover and for this purpose, as explained in greater detail in particular in the exemplary embodiments in FIGS. 6A to 6F, is embodied as transparent on at least one of the two side, such that ambient light 3 and/or ambient light 4 can be radiated onto the at least one organic light detecting layer of the first organic light detecting element 200.

By means of the non-transparent layers 311 described in association with FIG. 3A, which, in the exemplary embodiment shown, are formed by the non-transparent covering layer 301 on the substrate side and by the top electrode 304 on the opposite side of the at least one organic light detecting layer of the second organic light detecting element 300 relative to the substrate, it is possible to achieve a shading of the organic light detecting layer of the second organic light detecting element 300 from ambient light 3, 4. In particular, the non-transparent layers 311 can be non-transmissive at least to the extent of 90%, and particularly preferably at least to the extent of 99% or even to the extent of at least 99.9%, for that part of the ambient light which corresponds to the absorption spectrum of the at least one organic light detecting layer of the second organic light detecting element 300. As a result, the influence of the ambient light 3, 4 on the electrically measurable signal of the second organic light detecting element 300, that is to say, for example, a photovoltage in the case of an organic photodiode as second organic light detecting element, can be reduced or even completely prevented.

The organic optoelectronic component in accordance with the exemplary embodiment in FIGS. 3A and 3B and also in accordance with the subsequent exemplary embodiments is therefore designed to detect, by means of the first organic light detecting element 200 and the second organic light detecting element 300, independently of one another, internally guided light 2 generated by the organic light emitting element 100 and ambient light 3 and/or 4.

Variations and modifications of the organic optoelectronic component are possible in addition to the exemplary embodiments shown. By way of example, it is possible to vary the respective type of the organic light detecting elements with regard to the construction and the functioning and/or the electrical circuitry, the number of organic light detecting elements, the position of one or more organic light detecting elements in relation to the luminous area of the organic light emitting element, the respective detection area of the organic light detecting elements, for example, in relation to an adaptation to the organic light emitting element in terms of geometry, stack and/or circuitry, the respective distance between the organic light detecting elements and the organic light emitting element, the arrangement and number of one or more coupling-out layers and/or the waveguide properties in the substrate or the rest of the layer structure and thus the signal transmission between the organic light emitting element and the organic light detecting elements. Furthermore, the coupling-out direction of the organic light emitting element embodied as transparent can be influenced by suitable choice of materials and/or coupling-out layers, such that in the case where the organic optoelectronic component is used as part of a window, for example, different proportions can be emitted toward the inside and outside, that is to say approximately 40% toward the outside and 60% toward the inside. Provision can furthermore be made of additional functional layers for influencing the coupling-out direction.

Figure 4:
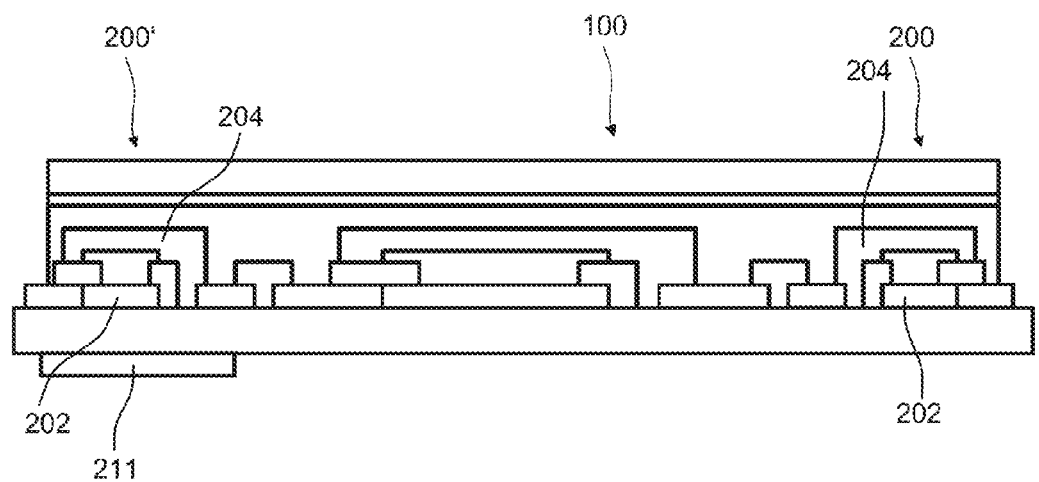
FIGS. 4 and 5 show schematic illustrations of organic optoelectronic components in accordance with further exemplary embodiments.

By way of example, FIG. 4 shows one exemplary embodiment of an organic optoelectronic component which, in comparison with the previous exemplary embodiment, has two first organic light detecting elements 200, 200', which are both designed to detect ambient light. The first organic light detecting elements 200, 200' can be embodied identically or differently and have identical or different detection directions, for example, by virtue of suitably chosen materials for the electrodes 202, 204. By way of example, one first organic light detecting element 200 can be designed to detect ambient light on both sides, while the other first organic light detecting element 200' has a non-transparent layer 211 on the substrate and detects ambient light only through the encapsulation and the cover. The non-transparent layer 211 can be embodied, for example, like the non-transparent layer 311 of the second organic light detecting element 300 in the previous exemplary embodiment.

Furthermore, it may also be possible to provide a plurality of second organic light detecting elements 300 or a plurality of first and second organic light detecting elements 200, 300.

Figure 5:
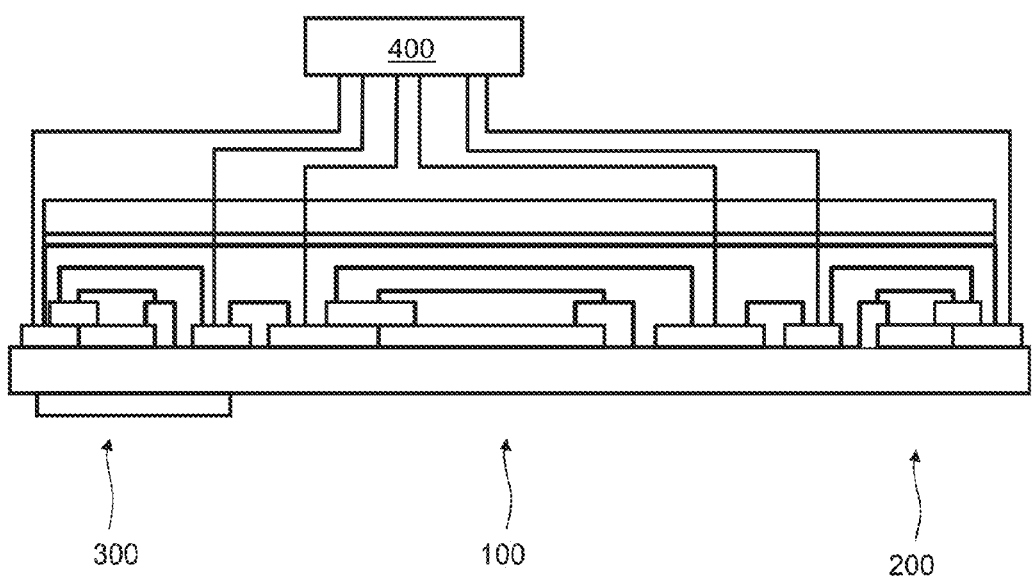

FIG. 5 shows an organic optoelectronic component in accordance with a further exemplary embodiment which, in comparison with the exemplary embodiment in FIGS. 3A and 3B, comprises an electronic component for electrical interconnections of the at least one organic light emitting element 100 and the at least one organic light detecting element comprising at least one first organic light detecting element 200 and at least one second organic light detecting element 300.

The interconnection possibility shown in FIG. 5 can also be combined with the other exemplary embodiments.

In the exemplary embodiment shown, the electronic component is embodied as a regulatable current and/or voltage source 400, which measures the electrical signal provided by the at least one organic light detecting element and regulates the organic light emitting element 100 depending on the measurement. In particular, the electronic component measures the electrically measurable signal which is provided by the at least one first organic light detecting element 200 and which is generated by light comprising ambient light. Furthermore, the electronic component measures the electrically measurable signal which is provided by the at least one second organic light detecting element 300 and which is generated by the light guided internally in the organic optoelectronic component from the organic light emitting element 100 to the organic light detecting element 300. The exemplary embodiment shown in FIG. 5 thus makes it possible to carry out a method for operating an organic optoelectronic component, wherein a regulatable current and/or voltage source 400 is provided, which measures the light detected by the at least one organic light detecting element and which regulates the at least one organic light emitting element 100 depending on the measurements.

As is shown in FIG. 5, the regulatable current and/or voltage source 400 can be an external electronic component which is interconnected with the elements 100, 200, 300 via suitable wire connections or conduction tracks. As an alternative thereto, it may also be possible to integrate a regulatable current and/or voltage source at least partly into the organic optoelectronic component, for example, by integration into the common substrate or by arrangement on the common substrate. In other words, the regulatable current and/or voltage source 400 can be provided as a monolithic electronic circuit, for example, in the substrate or in additional functional layers on the substrate. The regulatable current and/or voltage source 400 can have presetting possibilities which enable, for example, a desired brightness to be set depending on the ambient light of the optoelectronic component.

FIGS. 6A to 6K show exemplary embodiments of organic light detecting elements 200, 300 for organic optoelectronic components in accordance with the previous exemplary embodiments.

Figure 6A:
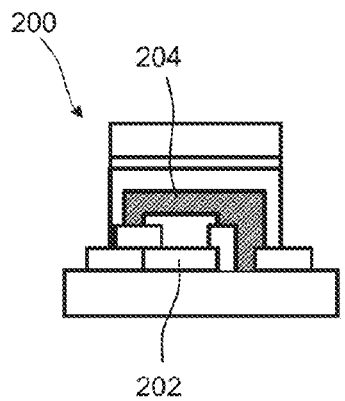
FIGS. 6A to 6K show schematic illustrations of organic light detecting elements for organic optoelectronic components in accordance with further exemplary embodiments.
Figure 6B:
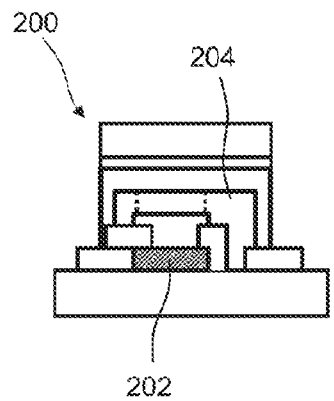
Figure 6C:
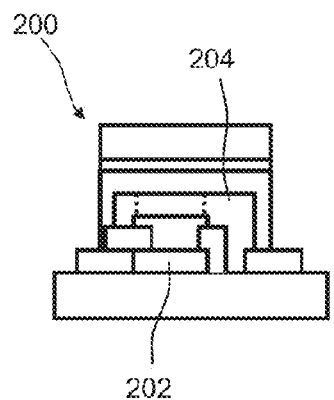

FIGS. 6A to 6C show various exemplary embodiments in which the different detection directions for the first organic light detecting element 200 are explained again, which is embodied purely by way of example as an organic photodiode as in the previous exemplary embodiments.

In the exemplary embodiment in FIG. 6A, the first organic light detecting element 200 has a transparent electrode 202 on the side of the organic functional layer stack facing the substrate, while the top electrode 204 arranged opposite is embodied as reflective or at least non-transparent, as is indicated by the hatching. By way of example, the transparent electrode 202 can be formed by a TCO, a transparent metal, that is to say a sufficiently thin metal layer, a metallic network structure, graphene or a combination and/or a plurality thereof, while the non-transparent electrodes 204 can be formed, for example, by a non-transparent metal, that is to say a sufficiently thick metal layer.

FIG. 6B shows one exemplary embodiment of a first organic light detecting element 200, in which, in contrast to the previous exemplary embodiment, the bottom electrode 202, that is to say the electrode arranged on the substrate side, is embodied as non-transparent and reflective, for example, as is indicated by the hatching, while the top electrode 204 arranged on the opposite side relative to the substrate is embodied as transparent or at least light-transmissive in partial regions, such that the first organic light detecting element 200 in this exemplary embodiment is designed to detect ambient light 4 that is radiated onto the organic optoelectronic component from the opposite side relative to the substrate.

The top electrode 204 can comprise, for example, a transparent material such as, for instance, a TCO or some other transparent material mentioned above. Alternatively or additionally, it may also be possible for the top electrode 204 to be embodied as a ring contact and to have, for example, an opening above the organic functional layer stack of the first organic light detecting element 200, as is indicated by the dashed lines. Such an opening can be enclosed completely by electrode material in a lateral direction, such that the electrode 204 can be embodied as a complete ring. Furthermore, it is also possible for an electrode 204 embodied as a ring contact to enclose the opening only in a partial region in a lateral direction and thus to be embodied in a U-shaped fashion, for example.

As an alternative to non-transparent electrode materials in the exemplary embodiments in FIGS. 6A and 6B, it is also possible to use transparent electrode materials in combination with a non-transparent additional material, for example, a non-transparent insulator material, wherein the additional non-transparent material can shade the organic material of the first organic light detecting element 200 from ambient light.

FIG. 6C shows a further exemplary embodiment of a first organic light detecting element 200, in which both electrodes 202, 204 are embodied as transparent and/or as ring contact, such that the first organic light detecting element 200 shown in FIG. 6C can detect ambient light that is radiated onto the organic optoelectronic component from both sides.

Figure 6D:
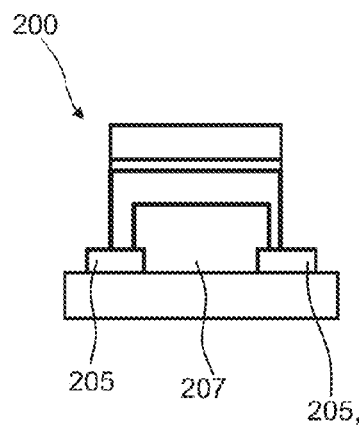
Figure 6E:
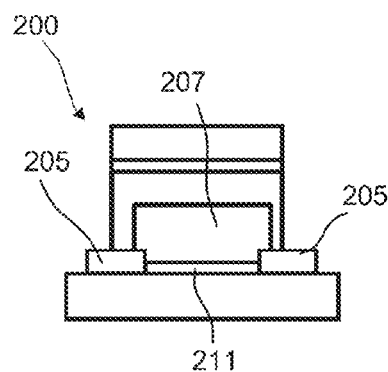
Figure 6F:
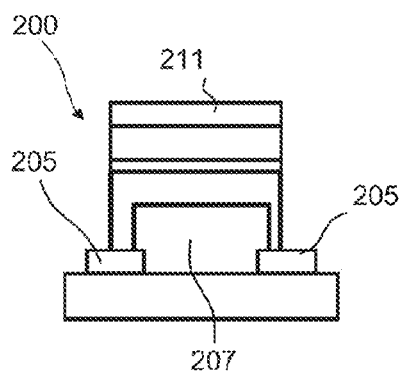
Figure 6G:
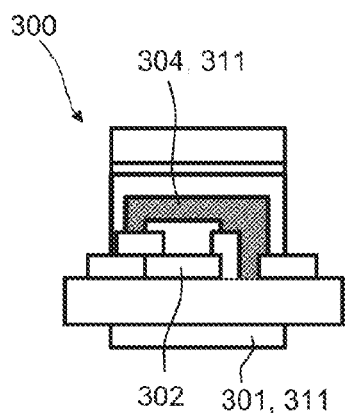
Figure 6H:
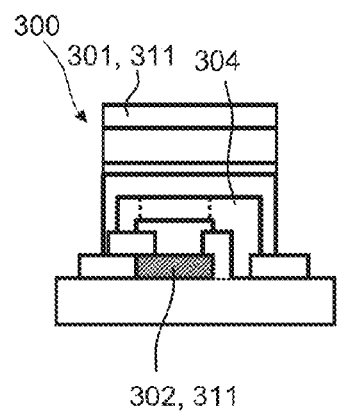
Figure 6I:
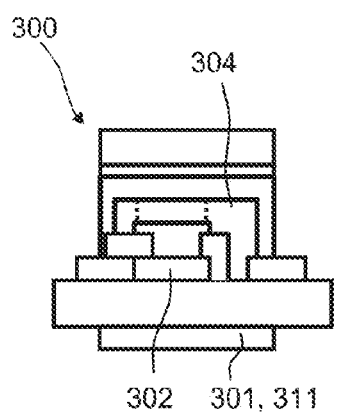

FIGS. 6D to 6F show first organic light detecting elements 200 which, in comparison with the previous exemplary embodiments, are embodied as organic photoconductor comprising an organic photoconductive material 207 as at least one organic light detecting layer of an organic functional layer stack which generates electrical charges upon irradiation by light.

Photoconductive organic materials can be embodied in one layer on an electrically conductive layer, for example, as in the exemplary embodiments shown, for example, on an electrode or on the electrode connection pieces 205 shown in FIGS. 6D to 6F also without an additional electrode. By way of example, the organic photoconductive material 207 can be based on a PVK-TNF charge transfer complex (PVK: polyvinylcarbazole, TNF: 2,4,7-trinitro-9-fluorenone). Furthermore, the organic photoconductive material 207 can, for example, also be embodied in two layers in the form of an organic charge generation layer and an organic layer that transports charge carriers. Examples of organic materials that generate charge carriers include (di)azo dyes, squaraine derivatives and phthalocyanines, and examples of organic materials that conduct charge carriers include arylamines, oxadiazoles, TPD (N,N'-bis(3-methylphenyl)-N,N'-bis(phenyl)benzidine) and NPB (N,N'-bis(naphthalen-1-yl)-N,N'-bis(phenyl)benzidine). Furthermore, an organic light detecting element embodied as organic photoconductor can have the same construction as the organic light emitting element 100, wherein here it is possible to utilize the depletion layer properties of the at least one pn junction of the organic active layer in the functional layer stacks.

The first organic light detecting element 200 in accordance with the exemplary embodiment in FIG. 6D allows ambient light to be detected on both sides. By contrast, the organic light detecting element 200 in accordance with FIG. 6E has a non-transparent layer 211 between the substrate and the at least one organic light detecting layer embodied as organic photoconductive material 207, which non-transparent layer can be formed, for example, by a non-transparent metal or a non-transparent plastic, such that ambient light can be detected on one side through the encapsulation and the cover. As an alternative thereto, a non-transparent layer can also be arranged on the opposite side of the substrate relative to the photoconductive material 207. In contrast to the exemplary embodiment in FIG. 6E, in the case of the exemplary embodiment in FIG. 6F, a non-transparent layer 211 is applied on the encapsulation, such that the first organic light detecting element 200 in FIG. 6F is designed for detecting ambient light on one side through the substrate.

Figure 6J:
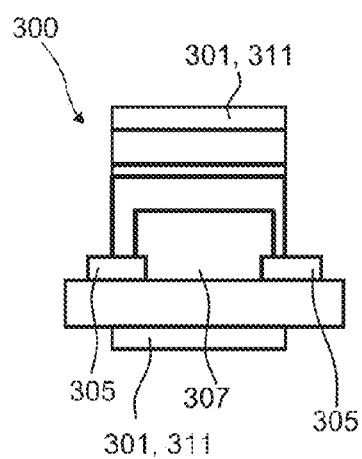
Figure 6K:
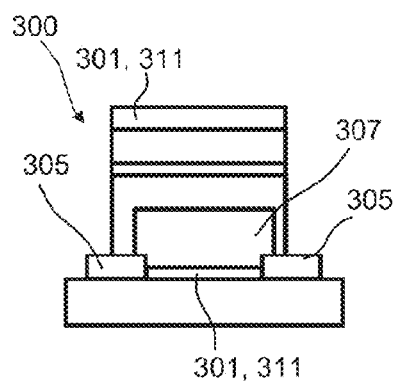

The exemplary embodiments shown in FIGS. 6G to 6K for second organic light detecting elements 300 correspond to the exemplary embodiments in FIGS. 6A to 6F in terms of their respective construction, wherein additional non-transparent layers 311 are provided here for shading the at least one organic light detecting layer, embodied as photoconductive material 307 in the exemplary embodiments in FIGS. 6J and 6K, on both sides.

Depending on materials and construction of the organic light detecting elements 200, 300 shown, the latter can also be constructed simultaneously as photoconductor and photodiode. Such an organic light detecting element can be usable as a photodiode with an electrical bias voltage and as a photoconductor without an electrical bias voltage.

Furthermore, depending on materials and construction, the electrical resistance of the organic light detecting elements 200, 300 can also be measured, such that the first and/or second organic light detecting element 200, 300 can be embodied and usable as organic photoresistor. By way of example, an organic light detecting element for this purpose can comprise an organic functional layer based on pentacene.

Figure 7A:
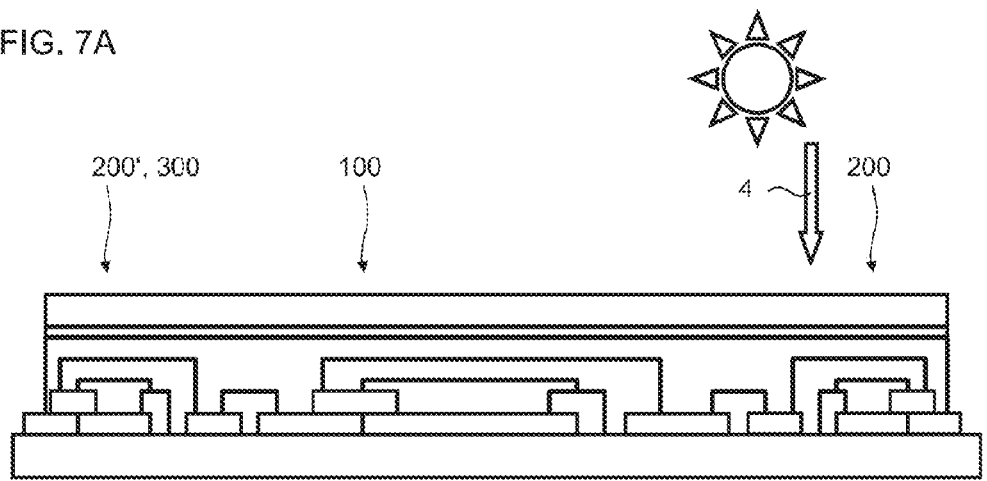
FIGS. 7A to 8B show schematic illustrations of organic optoelectronic components in accordance with further exemplary embodiments.
Figure 7B:
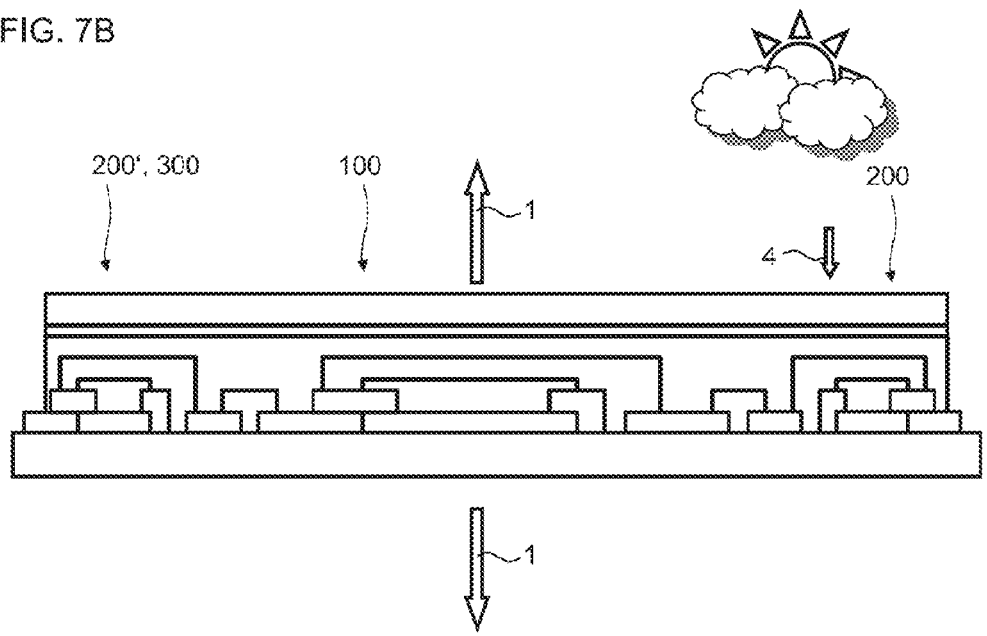

FIGS. 7A and 7B show one exemplary embodiment of an organic optoelectronic component which is embodied in accordance with the previous exemplary embodiments and which is embodied as part of a window. In the exemplary embodiment shown, the exterior side of the window corresponds to the top side of the organic optoelectronic component, as is indicated by the sun symbol, while the bottom side, that is to say the substrate side, faces an interior to be illuminated.

In the exemplary embodiment shown, a first organic light detecting element 200 is provided, which detects ambient light 4 on the exterior side, while a further organic light detecting element is provided, which is embodied, for example, as a further first organic light detecting element 200' for detecting ambient light in the interior or as a second organic light detecting element 300 for detecting light emitted by the at least one organic light emitting element 100.

In the case of a sufficient brightness in the exterior space, for example, as a result of insolation as shown in FIG. 7A, the organic light emitting element 100 is not operated, and so the organic optoelectronic component is transparent.

In the case of a lower brightness in the exterior space and thus in the case of an ambient light 4 having a lower intensity, for example, owing to clouds, overcast sky, rain or darkness as indicated in FIG. 7B, the luminous intensity of the organic light emitting element 100 can be automatically readjusted, such that the brightness in the interior has a desired value.

Figure 8A:
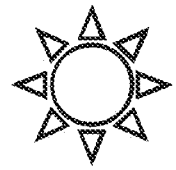
Figure 8A:
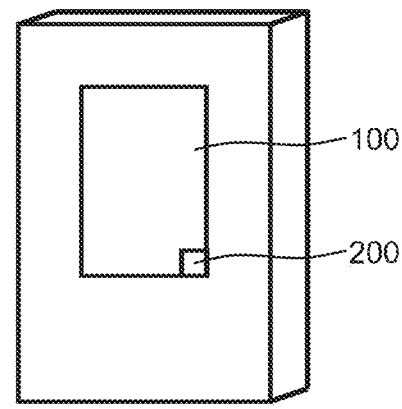
Figure 8B:
Figure 8B:
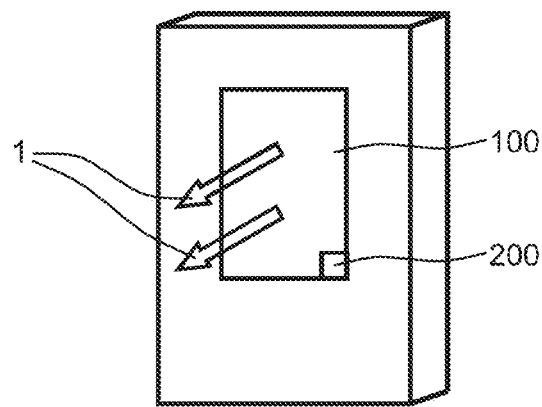

FIGS. 8A and 8B show a further exemplary embodiment, in which an organic optoelectronic component is integrated into a house door window, which has, for example, as in the previous exemplary embodiment, at least one organic light detecting element 200 for detecting ambient light in the exterior space in combination with an organic light emitting element 100. The organic optoelectronic component can be embodied as semitransparent, for example, and can be combined with safety glass. In the case of a sufficient exterior brightness, the organic light emitting component 100 is not in operation, as is shown in FIG. 8A. In the case where a certain exterior brightness is undershot, the organic light emitting element 100 is switched on on account of the corresponding sensor signal of the organic light detecting element 200, as is shown in FIG. 8B, wherein the main illumination direction can be toward the outside, for example.

By way of example, the organic light emitting component 100 can also be designed only partly as an OLED and/or be structured in strips, for example, such that an individual configuration of the interior and exterior lighting, for example, in the form of a pattern or name representation may be possible. The operation of the organic light emitting element 100 enables an effect as a so-called two-way mirror, which makes it more difficult to look through from the outside to the inside if the interior space is kept darker than the exterior space. Furthermore, the organic light emitting element 100 can additionally be coupled to a proximity sensor, such that automatic illumination of the exterior door region is possible.

The features and exemplary embodiments described in association with the figures can be combined with one another in accordance with further exemplary embodiments, even if such combinations are not explicitly described with the individual figures. Furthermore, the exemplary embodiments shown in the figures can have further or alternative features in accordance with the general description.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic optoelectronic component comprising:
    at least one organic light emitting element comprising an organic functional layer stack having at least one organic light emitting layer between two electrodes; and
    at least one organic light detecting element comprising at least one first organic light detecting element comprising at least one first organic light detecting layer, and at least one second organic light detecting element comprising at least one second organic light detecting layer,
    wherein the at least one organic light emitting element and the at least one organic light detecting element are arranged laterally adjacent on a common substrate,
    wherein the at least one first organic light detecting element is configured to detect ambient light,
    wherein the at least one second organic light detecting layer of the at least one second organic light detecting element is permanently arranged between two non-transparent layers, the two non-transparent layers shade the at least one second organic light detecting layer of the at least one second organic light detecting element from ambient light,
    wherein the two non-transparent layers reduce a portion of ambient light radiated onto the at least one second organic light detecting element by at least 90%, and
    wherein the at least one organic light emitting element is transparent and configured to emit light through the substrate and in a direction facing away from the substrate.

2. The component according to claim 1, wherein at least one of the two non-transparent layers comprises a non-transparent covering layer, the non-transparent covering layer being arranged on a side of the common substrate that faces away from the at least one second organic light detecting layer of the at least one second light detecting element.

3. The component according to claim 1, wherein at least one of the two non-transparent layers comprises a non-transparent covering layer, the non-transparent covering layer being arranged on a side of the common substrate that faces the at least one second organic light detecting layer of the at least one second light detecting element.

4. The component according to claim 1, wherein at least one of the two non-transparent layers comprises a non-transparent covering layer, the non-transparent covering layer, as viewed from the substrate, is arranged above the at least one second organic light detecting layer of the at least one second light detecting element.

5. The component according to claim 1, wherein at least one of the non-transparent layers comprises an electrode of the at least one second organic light detecting element.

6. The component according to claim 5, wherein the electrode is a non-transparent layer and is arranged on that side of the at least one second organic light detecting layer of the at least one second light detecting element which faces away from the common substrate.

7. The component according to claim 1, wherein the common substrate forms an optical waveguide, the optical waveguide guides light from the at least one organic light emitting element internally in the optoelectronic component to the at least one second light detecting element.

8. The component according to claim 1, wherein light generated during operation in the at least one organic light emitting layer of the at least one organic light emitting element is radiated internally in the optoelectronic component directly onto the at least one organic light detecting layer of the at least one organic second light detecting element.

9. The component according to claim 1, wherein the at least one first organic light detecting element is configured to detect ambient light through the substrate.

10. The component according to claim 1, wherein the at least one first organic light detecting element is configured to detect ambient light which is radiated onto the organic optoelectronic component from an opposite side of the organic optoelectronic component relative to the substrate.

11. The component according to claim 1, wherein the at least one first organic light detecting element and/or the at least one second organic light detecting element are/is an organic photodiode, an organic photoconductor and/or an organic photoresistor.

12. The component according to claim 1, wherein a plurality of first organic light detecting elements each configured to detect ambient light is arranged on the common substrate.

13. The component according to claim 1, wherein a plurality of second organic light detecting elements is arranged on the common substrate, wherein each of the plurality of second organic light detecting elements comprises at least one second organic light detecting layer arranged between two non-transparent layers, the two non-transparent layers shade the respective at least one second organic light detecting layer from ambient light.

14. A method for operating the organic optoelectronic component according to claim 1, the method comprising:
   applying a current and/or voltage to the organic optoelectronic component;
   measuring the light by the at least one organic light detecting element; and
   regulating the at least one organic light emitting element by regulating the current and/or voltage based on the light measurement.

15. The method according to claim 14, wherein the first organic light detecting element detects ambient light, and the second organic light detecting element detects light guided internally in the optoelectronic component from the at least one organic light emitting element to the at least one second organic light detecting element.

16. An organic optoelectronic component comprising:
   at least one organic light emitting element comprising an organic functional layer stack having at least one organic light emitting layer between two electrodes; and
   at least one organic light detecting element comprising at least one first organic light detecting element comprising at least one first organic light detecting layer,
   wherein the at least one organic light emitting element and the at least one organic light detecting element are arranged laterally adjacent on a common substrate,
   wherein the at least one first organic light detecting layer of the at least one first organic light detecting element is permanently arranged between two non-transparent layers, the two non-transparent layers shade the at least one first organic light detecting layer of the at least one first organic light detecting element from ambient light,
   wherein the two non-transparent layers reduce a portion of ambient light radiated onto the at least one first organic light detecting element by at least 90%, and
   wherein the at least one organic light emitting element is transparent and is configured to emit light through the substrate and in a direction facing away from the substrate.

* * * * *